(12) United States Patent
Yang

(10) Patent No.: US 7,998,826 B2
(45) Date of Patent: Aug. 16, 2011

(54) METHOD OF FORMING MARK IN IC-FABRICATING PROCESS

(75) Inventor: Chin-Cheng Yang, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 850 days.

(21) Appl. No.: 11/851,938

(22) Filed: Sep. 7, 2007

(65) Prior Publication Data

US 2009/0068843 A1 Mar. 12, 2009

(51) Int. Cl.
*H01L 21/027* (2006.01)
*H01L 23/544* (2006.01)

(52) U.S. Cl. . 438/401; 438/700; 257/797; 257/E21.525; 257/E23.179

(58) Field of Classification Search .................. 438/401, 438/700; 257/797, E23.179, E21.233, E21.525
See application file for complete search history.

(56) References Cited

U.S. PATENT DOCUMENTS

| | | | |
|---|---|---|---|
| 6,486,954 B1 | 11/2002 | Mieher et al. | |
| 6,921,916 B2 | 7/2005 | Adel et al. | |
| 6,985,618 B2 | 1/2006 | Adel et al. | |
| 7,068,833 B1 | 6/2006 | Ghinovker et al. | |
| 7,440,105 B2 * | 10/2008 | Adel et al. | 356/401 |
| 2003/0119275 A1 * | 6/2003 | Dewa et al. | 438/401 |
| 2004/0233443 A1 | 11/2004 | Mieher et al. | |
| 2004/0259320 A1 * | 12/2004 | Holscher et al. | 438/401 |
| 2005/0070069 A1 * | 3/2005 | Baluswamy et al. | 438/401 |
| 2005/0244729 A1 * | 11/2005 | Liu et al. | 430/30 |
| 2005/0255387 A1 * | 11/2005 | Butt et al. | 430/5 |
| 2006/0131576 A1 * | 6/2006 | Koh et al. | 257/48 |
| 2008/0032205 A1 * | 2/2008 | Chiu et al. | 430/5 |
| 2008/0034344 A1 * | 2/2008 | Chiu et al. | 716/21 |
| 2008/0085600 A1 * | 4/2008 | Furukawa et al. | 438/637 |
| 2008/0153012 A1 * | 6/2008 | Liu et al. | 430/5 |
| 2009/0068843 A1 * | 3/2009 | Yang | 438/700 |
| 2009/0194840 A1 | 8/2009 | Noelscher et al. | 257/499 |
| 2009/0273102 A1 * | 11/2009 | Nogami et al. | 257/797 |
| 2009/0298254 A1 * | 12/2009 | Koyama et al. | 438/401 |

FOREIGN PATENT DOCUMENTS

TW 526517 4/2003

* cited by examiner

*Primary Examiner* — Mary Wilczewski
(74) *Attorney, Agent, or Firm* — J.C. Patents

(57) ABSTRACT

A method of forming a mark in an IC fabricating process is described. Two parts of the mark each including a plurality of linear patterns are respectively defined by two exposure steps that either belong to two lithography processes respectively or constitute a double-exposure process including X-dipole and Y-dipole exposure steps.

6 Claims, 8 Drawing Sheets

$x_1 = (x_{1a} + x_{1b})/2, \; x_2 = (x_{2a} + x_{2b})/2, \; x_3 = (x_{3a} + x_{3b})/2$ $y_1 = (y_{1a} + y_{1b})/2, \; y_2 = (y_{2a} + y_{2b})/2, \; y_3 = (y_{3a} + y_{3b})/2$

METHOD OF FORMING MARK IN IC-FABRICATING PROCESS

BACKGROUND OF THE INVENTION

1. Field of the Invention

This invention relates to fabrication of integrated circuits, and more particularly to a method of forming a mark in an IC-fabricating process, wherein the mark is defined by two exposure steps and can serve as a basis of an overlay mark.

2. Description of the Related Art

Through an IC-fabricating process, various marks are formed on the wafer for different purposes. For example, to check the alignment accuracy between the patterns of lower and upper wafer layers that is more and more important as the linewidth gets smaller increasingly, a wafer is formed with many overlay marks in some non-die areas. A conventional overlay mark is the so-called box-in-box (BIB) overlay mark, but such overlay marks are too sensitive to certain factors other than the alignment so that the alignment accuracy cannot be checked accurately. Hence, the overlay mark of AIM (advanced imaging mark) type is provided in the prior art.

Referring to FIG. 1, a conventional AIM-type overlay mark 100 is disposed in a non-die area of the wafer (not shown) including four adjacent regions 102-108, which are arranged in a 2×2 array and include a first region 102 and a second region 104 arranged diagonally and a third region 106 and a fourth region 108 arranged diagonally, and includes a portion of the lower layer defined by a lithography process for defining the die patterns of the lower layer and a patterned photoresist layer formed in a lithography process for defining the die patterns of the upper layer. The portion of the lower layer includes a first set of x-directional linear patterns 110 arranged in the y-direction in one half of the first region 102, a second set of x-directional linear patterns 112 arranged in the y-direction in one half of the second region 104, a first set of y-directional linear patterns 114 arranged in a x-direction in one half of the third region 106, and a second set of y-directional linear patterns 116 arranged in the x-direction in one half of the fourth region 108. The patterned photoresist layer includes a first set of x-directional photoresist bars 118 arranged in the y-direction in the other half of the first region 102, a second set of x-directional photoresist bars 120 arranged in the y-direction in the other half of the second region 104, a first set of y-directional photoresist bars 122 arranged in the x-direction in the other half of the third region 106, and a second set of y-directional photoresist bars 124 arranged in the x-direction in the other half of the fourth region 108.

The linear patterns 110-116 and photoresist bars 118-124 are designed such that when the lower layer is fully aligned with the upper layer, the central line of respective central lines of the first set of x-directional linear patterns 110 and the second set of x-directional linear patterns 112 coincides with that of respective central lines of the first set of x-directional photoresist bars 118 and the second set of x-directional photoresist bars 120, and the central line of respective central lines of the first set of y-directional linear patterns 114 and the second set of y-directional linear patterns 116 coincides with that of respective central lines of the first set of y-directional photoresist bars 122 and the second set of y-directional photoresist bars 124.

To check the alignment, the y-coordinate "$y_{1a}$" of the central line of the first set of x-directional linear patterns 110, the y-coordinate "$y_{1b}$" of the central line of the second set of x-directional linear patterns 112, the x-coordinate "$x_{1a}$" of the central line of the first set of y-directional linear patterns 114, the x-coordinate "$x_{1b}$" of the central line of the second set of y-directional linear patterns 116, the y-coordinate "$y_{2a}$" of the central line of the first set of x-directional photoresist bars 118, the y-coordinate "$y_{2b}$" of the central line of the second set of x-directional photoresist bars 120, the x-coordinate "$x_{2a}$" of the central line of the first set of y-directional photoresist bars 122 and the x-coordinate "$x_{2b}$" of the central line of the second set of y-directional photoresist bars 124 are derived at first.

The method of deriving the x- and y-coordinates is exemplified by the following process of deriving $x_{1a}$ that is shown in FIG. 2. The first y-directional linear patterns 114 are scanned by a light beam (not shown) in the direction 200 to obtain a reflectivity curve 202, and respective x-coordinates of the six first y-directional linear patterns 114 are determined based on the reflectivity curve 202. When the linear patterns 110-116 are, for example, trenches in the portion of the lower layer, $x_{1a}$ is calculated as the average of the x-coordinates $x_{1a1}, x_{1a2}, x_{1a3}, x_{1a4}, x_{1a5}$ and $x_{1a6}$ of the six locally minimal points of the reflectivity curve 202.

Then, the x-directional alignment error of the die patterns of the upper layer with those of the lower layer near the overlay mark is calculated as "$(x_{2a}+x_{2b})/2-(x_{1a}+x_{1b})/2$", and the y-directional alignment error of the die patterns of the upper layer with those of the lower layer near the overlay mark is calculated as "$(y_{2a}+y_{2b})/2-(y_{1a}+y_{1b})/2$". After the x-directional alignment errors and y-directional alignment errors at different areas of the wafer are determined using the overlay marks thereat, overlay analyses can be done for better control of the exposure system.

Moreover, when the lower layer is defined by two exposure steps, in the prior art, two above overlay marks have to be formed for the two exposure steps respectively, so that the x-directional and y-directional alignments of the die patterns defined by the first exposure step as well as those of the die patterns defined by the second exposure step with the die patterns of the upper layer can be checked.

However, when one exposure step uses X-dipole off-axis light to define patterns requiring higher resolution in the x-direction and the other uses Y-dipole off-axis light to define patterns requiring higher resolution in the y-direction, each set of x-directional linear patterns arranged in the y-direction in the overlay mark 100' for the X-dipole exposure merge together, as shown in FIG. 3(a), and each set of y-directional linear patterns arranged in the x-direction in the overlay mark 100" for the Y-dipole exposure step merge together, as shown in FIG. 3(b). Therefore, a half area of each overlay mark cannot be utilized in the alignment check and is wasted.

SUMMARY OF THE INVENTION

Accordingly, this invention provides a method of forming a mark in an IC-fabricating process, which can be modified to be a method of forming an overlay mark that allows the number of overlay marks required to be reduced by 50%.

In the method, a first part and a second part of the linear patterns of the mark are formed from a portion of a material layer and are respectively defined by two exposure steps that either belong to two lithography processes respectively or constitute a double-exposure process including X-dipole and Y-dipole exposure steps.

In an embodiment of the method of this invention, a plurality of first trenches is formed in a portion of a material layer on a wafer through a first lithography process and a first etching process. A plurality of second trenches is formed in the portion of the material layer through a second lithography process and a second etching process. The first trenches and the second trenches are arranged alternately, and the width of a first or second trench is substantially equal to the distance between a pair of first and second trenches that are closest to each other.

By forming over the portion of the material layer a plurality of photoresist bars in a lithography process for defining an upper layer above the material layer after the first and second trenches are formed, an overlay mark can be obtained.

In another embodiment of the method of this invention, the IC fabricating process includes a double exposure process including an X-dipole exposure step and a Y-dipole exposure step. A plurality of y-directional linear patterns in parallel is defined in a photoresist layer over a portion of a material layer on a wafer in the X-dipole exposure step. A plurality of x-directional linear patterns in parallel is defined in the photoresist layer over the portion of the material layer in the Y-dipole exposure step. The y-directional and x-directional linear pattern are developed in the development step of the photoresist layer, and then the portion of the material layer is patterned using the photoresist layer thereon as an etching mask. In this embodiment, the region for forming the x-directional linear patterns is masked in the X-dipole exposure step, and the region for forming the y-directional linear patterns is masked in the Y-dipole exposure step.

Similarly, by forming a plurality of x-directional photoresist bars and a plurality of y-directional photoresist bars in a lithography process for defining an upper layer above the material layer after the portion of the material layer is patterned, an overlay mark can be obtained.

In the former embodiment, since one mark formed includes a first and a second parts that are respectively defined by two exposure steps belonging to two lithography processes, the relationship between the material layer defined by the first exposure step and that defined by the second exposure step can be derived from one mark. In the latter embodiment, since the y-directional linear patterns in parallel are defined in the X-dipole exposure step that well resolves x-directionally separated patterns and the x-directional linear patterns in parallel are defined in the Y-dipole exposure step that well resolves y-directionally separated patterns, no linear patterns in parallel are merged together in one mark. Therefore, all the area of each mark can be utilized.

In a case where the mark of the former or latter embodiment is further made into an overlay mark, since the overlay mark includes a first and a second parts respectively defined by two exposure steps that belong to two lithography processes or a double exposure process including X- and Y-dipole exposure steps, the alignment accuracy between the lower layer defined by one exposure step and the upper layer as well as that between the lower layer defined by the other exposure step and the upper layer both can be checked with only one of the overlay mark.

It is noted that both the foregoing general description and the following detailed description are just exemplary, and are intended to provide further explanation of the invention as claimed.

DESCRIPTION OF THE PREFERRED EMBODIMENTS

It is noted that the following embodiments are intended to further explain this invention but not to restrict the scope of this invention.

First Embodiment

Figure 1:
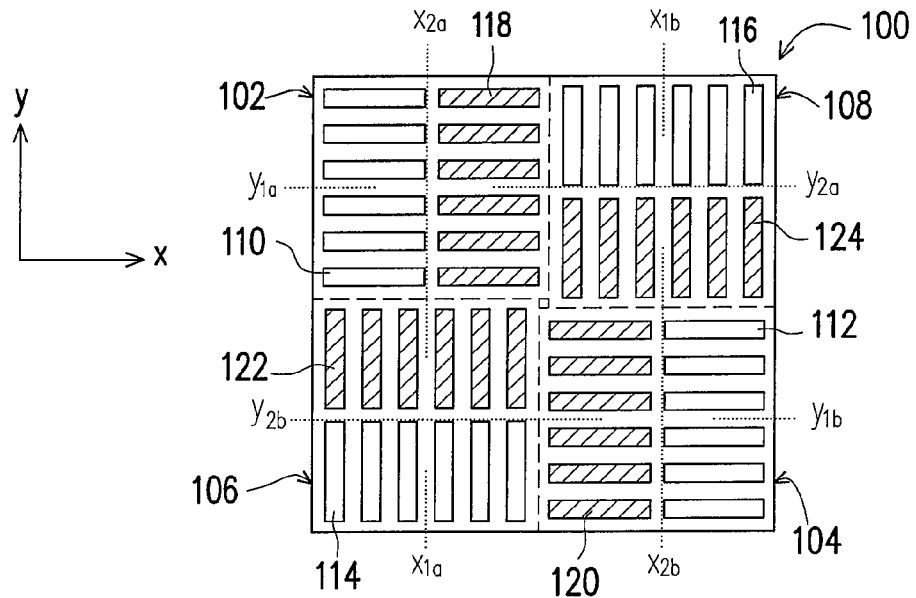
FIG. 1 illustrates a conventional AIM-type overlay mark in the prior art.
Figure 2:
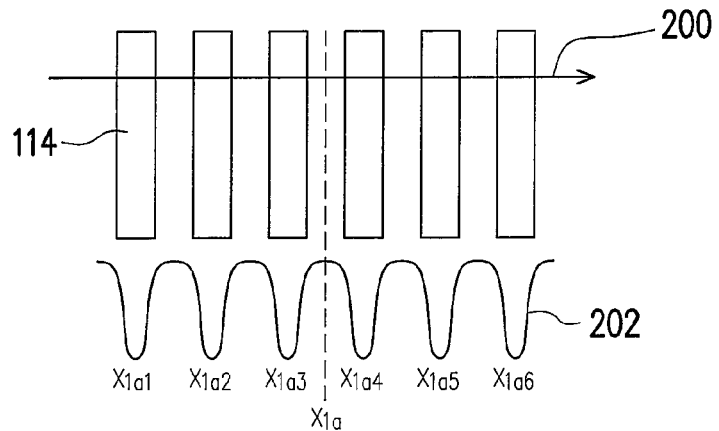
FIG. 2 illustrates a method of deriving the x-coordinate of the central line of a set of y-directional linear patterns arranged in the x-direction in the overlay mark of FIG. 1.
Figure 3:
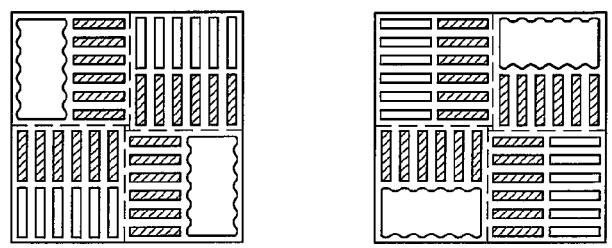
FIG. 3(a)/(b) illustrates that a set of the x-/y-directional linear patterns arranged in the y-/x-direction merge together in an overlay mark for X-/Y-dipole exposure.
Figure 4A:
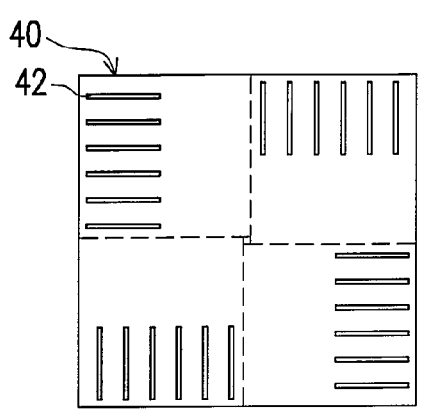
FIGS. 4A-4C illustrate a method of forming an overlay mark according to a first embodiment of this invention, wherein FIG. 4C(b) illustrates the overlay mark.
Figure 4A:
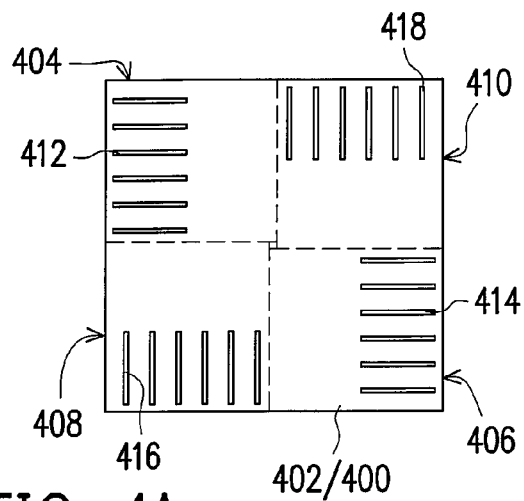
Figure 4B:
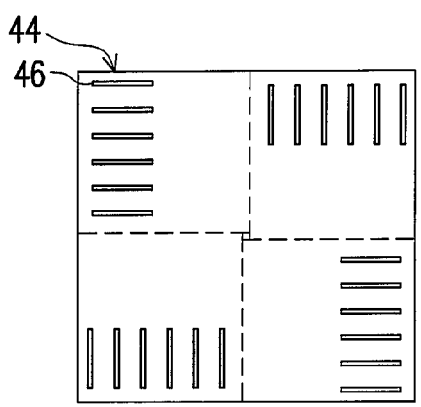
Figure 4B:
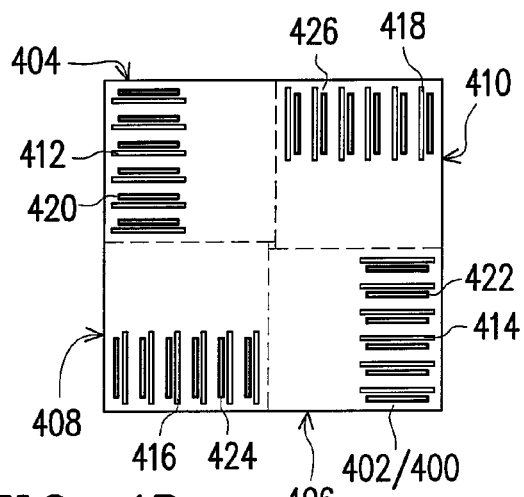
Figure 4C:
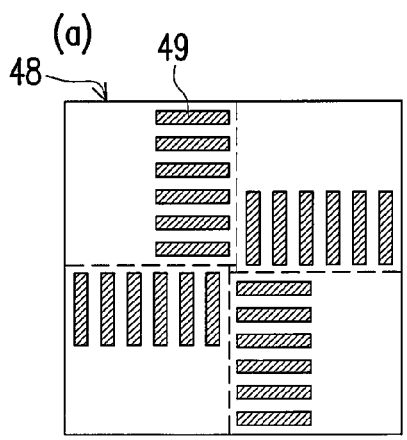
Figure 4C:
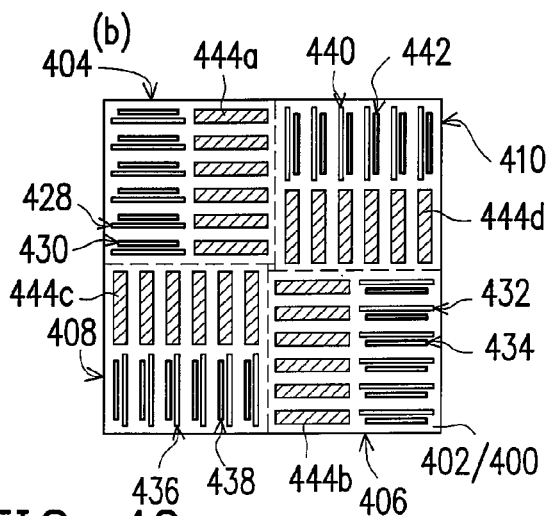

FIGS. 4A-4C illustrate a method of forming an overlay mark according to the first embodiment of this invention, wherein FIG. 4C(b) illustrates the overlay mark.

Referring to FIG. 4A, after a lower layer including a portion 402 for forming the overlay mark is formed on a substrate 400, a first lithography process and a subsequent etching process are conducted. The first lithography process includes a first exposure step that uses a first photomask having die patterns (not shown) and an overlay mark area 40 with trench patterns 42 for forming an overlay mark. Through the first lithography process and the subsequent etching process, the die patterns on the first photomask are transferred to the lower layer in the die areas (not shown), and trenches corresponding to the trench patterns 42 are formed in the portion 402 of the lower layer in the overlay mark area on the wafer.

The overlay mark area on the wafer includes four regions that are arranged in a 2×2 array and include a first region 404 and a second region 406 arranged diagonally and a third region 408 and a fourth region 410 arranged diagonally. The trenches in the portion 402 of the lower layer include a first set of x-directional trenches 412 arranged in the y-direction in one half of the first region 404, a second set of x-directional trenches 414 arranged in the y-direction in one half of the second region 406, a first set of y-directional trenches 416 arranged in the x-direction in one half of the third region 408, and a second set of y-directional trenches 418 arranged in the x-direction in one half of the fourth region 410. In this embodiment, the photomask trench patterns corresponding to the trenches in each of the above sets are equally spaced, and each of the trenches has a width smaller than that of one linear pattern in a conventional AIM-type overlay mark, such as about ⅓ of the latter.

Referring to FIG. 4B, a second lithography process and a subsequent etching process are performed, wherein the former includes a second exposure step that uses a second photomask having die patterns (not shown) and an overlay mark area 44 with trench patterns 46 for forming the overlay mark. Through the second lithography process and the subsequent etching process, the die patterns on the second photomask are transferred to the lower layer in die areas (not shown), and trenches corresponding to the trench patterns 46 are formed in the portion 402 of the lower layer. The trenches include a third set of x-directional trenches 420 arranged in the y-direction in the one half of the first region 404, a fourth set of x-directional trenches 422 arranged in the y-direction in the one half of the second region 406, a third set of y-directional trenches 424 arranged in the x-direction in the one half of the third region 408, and a fourth set of y-directional trenches 426 arranged in x-direction in the one half of the fourth region 410. In this embodiment, the photomask trench patterns corresponding to the trenches in each of the above sets are equally spaced and each of the trenches has a width smaller than that of one linear pattern in a conventional AIM-type overlay mark, such as about ⅓ of the latter.

The trench patterns 42 on the first photomask and the trench patterns 46 on the second photomask are positioned such that the x-directional trenches 412 and the x-directional trenches 420 defined by different exposure steps are arranged alternately in the one half of the first region 404, the x-directional trenches 414 and the x-directional trenches 422 defined by different exposure steps are arranged alternately in the one half of the second region 406, the y-directional trenches 416 and the y-directional trenches 424 defined by different exposure steps are arranged alternately in the one half of the third region 408, and the y-directional trenches 418 and the y-directional trenches 426 defined by different exposure steps are arranged alternately in the one half of the fourth region 410.

The distance between a trench 420 (422, 424 or 426) defined by the second lithography process and the trench 412 (414, 416 or 418) defined by the first one to be closest to the former may also be about ⅓ of the width of one linear pattern in a conventional AIM-type overlay mark. That is, the width of a trench 412, 414, 416, 418, 420, 422, 424 or 426 may be substantially equal to the distance between a pair of trenches 412 and 420 (414 and 422, 416 and 424, or 418 and 426) that are closest to each other.

After an upper layer (not shown) is formed over the wafer, a lithography process is conducted using a third photomask that has die patterns (not shown) and an overlay mark area 48 with line patterns 49 for forming the overlay mark. With the lithography process, the die patterns on the third photomask are transferred to the die areas (not shown) on the wafer, and a patterned photoresist layer as a part of the overlay mark is formed on the portion 402 of the lower layer. The patterned photoresist layer includes a first set of x-directional photoresist bars 444a arranged in the y-direction in the other half of the first region 404, a second set of x-directional photoresist bars 444b arranged in the y-direction in the other half of the second region 406, a first set of y-directional photoresist bars 444c arranged in the x-direction in the other half of the third region 408, and a second set of y-directional photoresist bars 444d arranged in the x-direction in the other half of the fourth region 410. The width of a y- or x-directional photoresist bar may be about 1 W and the pitch between the photoresist bars about 2 W, as in a conventional AIM-type overlay mark.

The trench patterns 42 and 46 and the line patterns 49 on the above first to third photomasks are arranged such that when the lower layer is fully aligned with the upper layer, the following relationships are made. First, the central line of respective central lines of the x-directional trenches 428 and the x-directional trenches 432, that of respective central lines of the x-directional trenches 430 and the x-directional trenches 434 and that of respective central lines of the x-directional photoresist bars 444a and x-directional photoresist bars 444b coincide with each other. Second, the central line of respective central lines of the y-directional trenches 436 and the y-directional trenches 440, that of respective central lines of the y-directional trenches 438 and the y-directional trenches 442 and that of respective central lines of the y-directional photoresist bars 444c and the y-directional photoresist bars 444d coincide with each other.

Moreover, the trench patterns 42 and 46 and the line patterns 49 on the above first to third photomasks are preferably configured such that the set of x-directional trenches 428 or 430, the set of y-directional trenches 436 or 438, the set of x-directional trenches 432 or 434 and the set of y-directional trenches 440 or 442 are not arranged adjacently but the set of x-directional photoresist bars 444a, the set of y-directional photoresist bars 444c, the set of x-directional bars 444b and the set of y-directional photoresist bars 444d are arranged adjacently.

Further, the lithography process using the first photomask and that using the second photomask can alternatively be conducted in the reverse order without changing the patterns of the overlay mark.

Figure 5:
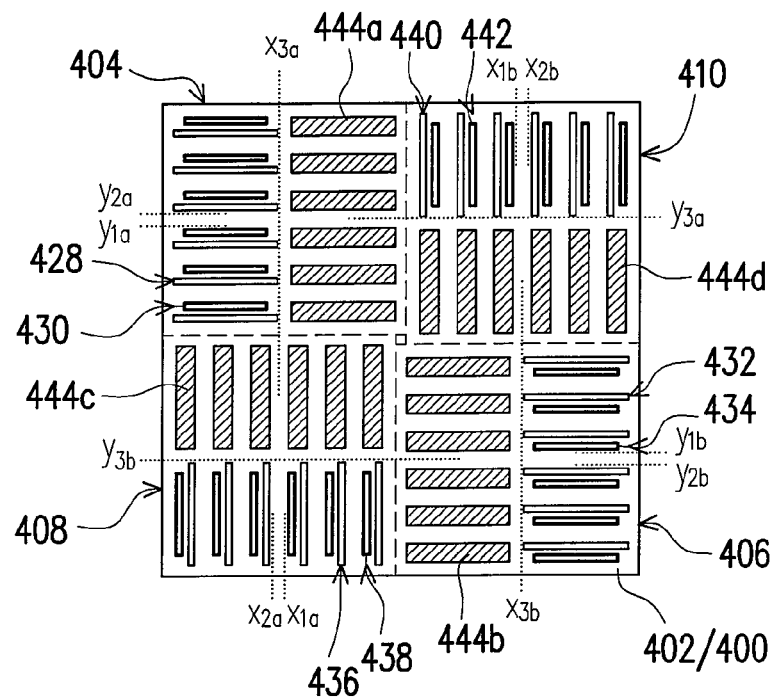
FIG. 5 illustrates exemplary use of the overlay mark of FIG. 4C(b).

Referring to FIG. 5, to check the alignment between the lower layer and the upper layer, the y-coordinate "$y_{1a}$" of the central line of the x-directional trenches 428, the y-coordinate "$y_{2a}$" of the central line of the x-directional trenches 430, the y-coordinate "$y_{1b}$" of the central line of the x-directional trenches 432, the y-coordinate "$y_{2b}$" of the central line of the x-directional trenches 434, the x-coordinate "$x_{1a}$" of the central line of the y-directional trenches 436, the x-coordinate "$x_{2a}$" of the central line of the y-directional trenches 438, the x-coordinate "$x_{1b}$" of the central line of the y-directional trenches 440, the x-coordinate "$x_{2b}$" of the central line of the y-directional trenches 442, the y-coordinate "$y_{3a}$" of the central line of the x-directional photoresist bars 444a, the y-coordinate "$y_{3b}$" of the central line of the x-directional photoresist bars 444b, the x-coordinate "$x_{3a}$" of the central line of the y-directional photoresist bars 444c and the x-coordinate "$x_{3b}$" of the central line of the y-directional photoresist bars 444d are derived. The method of deriving the above x-coordinates and y-coordinates may be the one illustrated in FIG. 6, wherein the derivation of $x_{1a}$ and $x_{2a}$ is exemplified.

Figure 6:
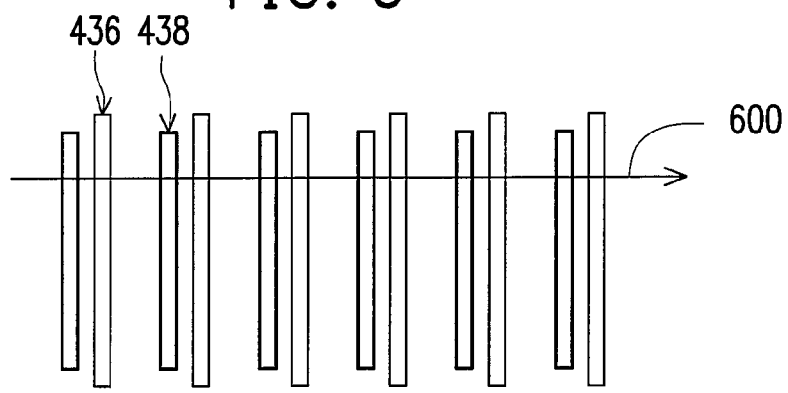
FIG. 6 shows a method of deriving the x-coordinates of respective central lines of two sets of y-directional linear patterns respectively defined by the first and second exposure steps and intermixed with each other according to the first embodiment.
Figure 6:
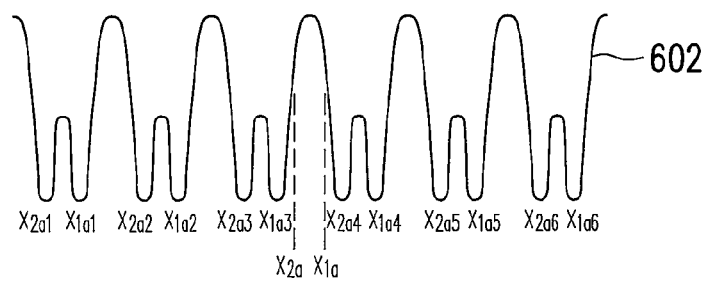

Referring to FIG. 6, respective x-coordinates of the trenches 436 and 438, $x_{1a1}$-$x_{1a6}$ and $x_{2a1}$-$x_{2a6}$, are determined, possibly by scanning the trenches with a light beam in the direction 600 and simultaneously detecting the reflected light and then analyzing the variation of the reflectivity. When the lower layer having the trenches 436 and 438 therein is a dielectric layer and the upper layer is a conductive layer, or when the lower layer is a conductive layer and the upper layer is a dielectric layer, for example, a trench in the lower layer lowers the reflectivity so that the reflectivity variation has a profile 602, from which the coordinates $x_{1a1}$-$x_{1a6}$ and $x_{2a1}$-$x_{2a6}$ can be determined by locating the locally minimal points thereof. Thereafter, $x_{1a}$ is calculated as the average of the six x-coordinates of the six locally minimal points of the curve 602 corresponding to the six trenches 436, and $x_{2a}$ is calculated as the average of the six x-coordinates of the six locally minimal points corresponding to the six trenches 438.

After the coordinate $y_{1a}$, $y_{2a}$, $y_{1b}$, $y_{2b}$, $x_{1a}$, $x_{2a}$, $x_{1b}$, $x_{2b}$, $y_{3a}$, $y_{3b}$, $x_{3a}$ and $x_{3b}$ are derived similarly, the x-directional alignment error of the die patterns of the upper layer with the die patterns of the lower layer defined by the first exposure step is calculated as "$(x_{3a}+x_{3b})/2-(x_{1a}+x_{1b})/2$", and the y-directional alignment error of the same is calculated as "$(y_{3a}+y_{3b})/2-(y_{1a}+y_{1b})/2$". The x-directional alignment error of the die patterns of the upper layer with the die patterns of the lower layer defined by the second exposure step is calculated as "$(x_{3a}+x_{3b})/2-(x_{2a}+x_{2b})/2$", and the y-directional alignment error of the same is calculated as "$(y_{3a}+y_{3b})/2-(y_{2a}+y_{2b})/2$". In addition, the x-directional alignment error of the die patterns of the lower layer defined by the second exposure step with those defined by the first exposure step is calculated as "$(x_{2a}+x_{2b})/2-(x_{1a}+x_{1b})/2$", and the y-directional alignment error of the same is calculated as "$(y_{2a}+y_{2b})/2-(y_{1a}+y_{1b})/2$".

Since two sets of x-directional trenches and two sets of y-directional trenches defined by the first exposure step as well as two sets of x-directional trenches and two sets of y-directional trenches defined by the second exposure step are dispose in one overlay mark of the first embodiment, the x-directional alignment and y-directional alignment of the die patterns defined by the first exposure step as well as those of the die patterns defined by the second exposure step with the upper layer can be checked based on only one overlay mark. The x-directional and y-directional alignments of the die patterns defined by the first exposure step with those defined by the second exposure step can also be checked based on the same overlay mark.

Second Embodiment

Embodiment 2.1

Figure 7A:
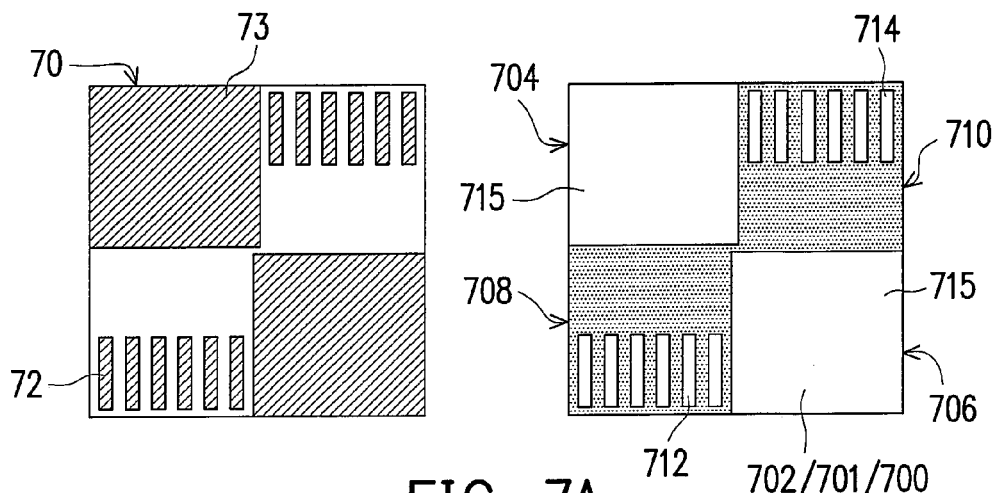
FIGS. 7A-7C illustrate a first method of forming an overlay mark according to a second embodiment of this invention, wherein FIG. 7C(b) shows the overlay mark.
Figure 7B:
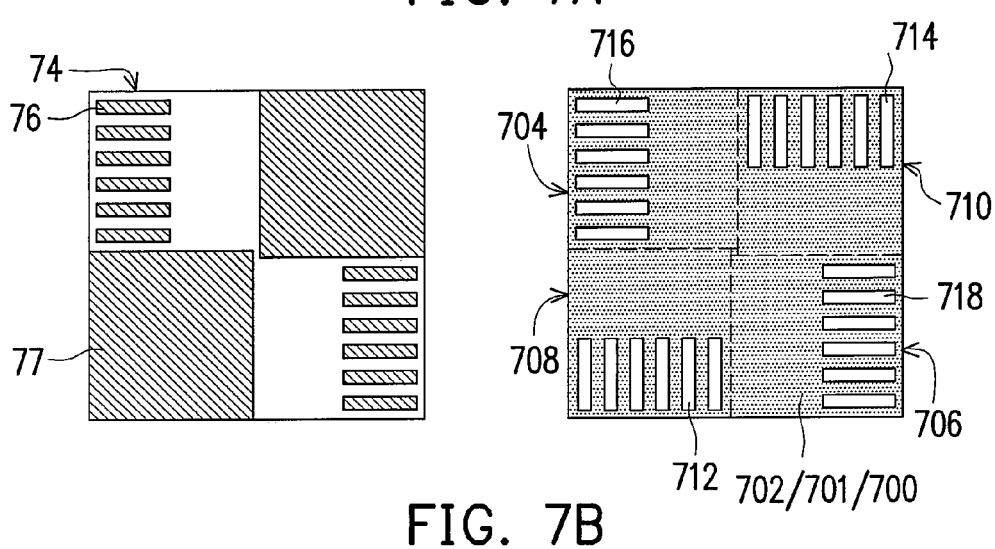
Figure 7C:
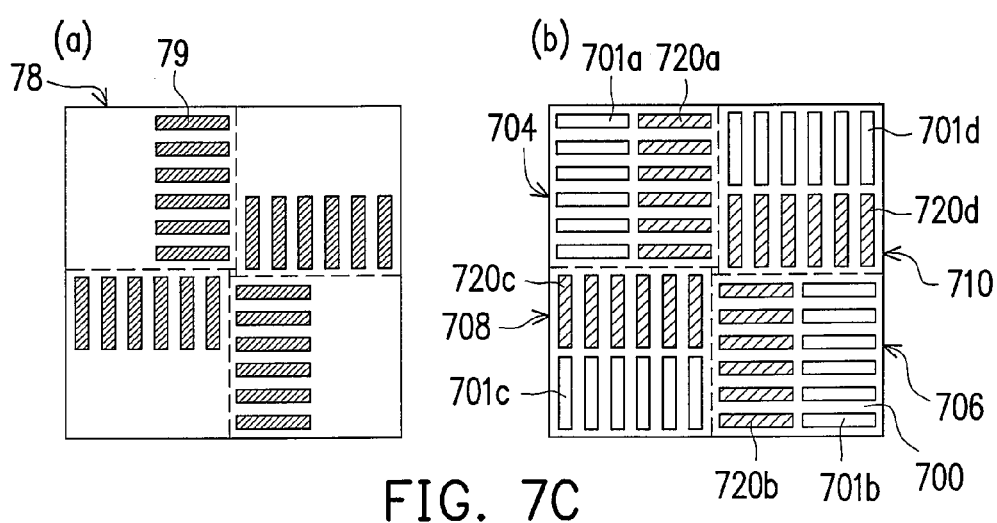

FIGS. 7A-7C illustrate a first method of forming an overlay mark according to the second embodiment of this invention, wherein FIG. 7C(b) shows the overlay mark.

Referring to FIG. 7A, after a positive photoresist layer 702 is formed on a lower layer that is on a substrate 700 and includes a portion 701 for forming the overlay mark, an X-dipole exposure step is conducted using a first photomask that has die patterns (not shown) and an overlay mark area 70 with x-directionally separated y-directional line patterns 72 and light-blocking layers 73. Through the X-dipole exposure step, the die patterns on the first photomask are transferred to the photoresist layer 702 in the die areas (not shown), and linear unexposed regions corresponding to the line patterns 72 are formed in the photoresist layer 702 on the portion 701 of the lower layer in the overlay mark area on the wafer.

The overlay mark area on the wafer includes four regions arranged in a 2×2 array that include a first region 704 and a second region 706 arranged diagonally and a third region 708 and a fourth region 710 arranged diagonally. The linear unexposed regions corresponding to the line patterns 72 include a first set of y-directional linear unexposed regions 712 arranged in the x-direction in one half of the third region 708 and a second set of y-directional linear unexposed regions 714 arranged in the x-direction in one half of the fourth region 710. Unexposed regions 715 are also formed occupying the whole first region 704 and the whole second region 706 because of the light-blocking layers 73. The line patterns 72 corresponding to the linear unexposed regions in each of the above sets are equally spaced.

Referring to FIG. 7B, a Y-dipole exposure step is conducted using a second photomask that has die patterns (not shown) and an overlay mark area 74 with y-directionally separated x-directional line patterns 76 and light-blocking layers 77. Through the Y-dipole exposure step, the die patterns on the second photomask are transferred to the photoresist layer 702 in the die areas (not shown), and linear unexposed regions corresponding to the line patterns 76 are formed in the photoresist layer 702 on the portion 701 of the lower layer. The linear unexposed regions include a first set of x-directional linear unexposed regions 716 arranged in the y-direction in one half of the first region 704 and a second set of x-directional linear unexposed regions 718 arranged in the y-direction in one half of the second region 706. The linear unexposed regions 712 and 714 formed previously in the X-dipole exposure step are masked by the light-blocking layers 77 in the Y-dipole exposure step. It is noted that the photoresist layer 702 on the portion 701 of the lower layer except all the linear unexposed regions constitutes an exposed region. The line patterns 76 corresponding to the linear unexposed regions in each of the above sets are also equally spaced.

Referring to FIG. 7C, since the photoresist material in the unexposed regions 712, 714, 716 and 718 is retained together with that in the unexposed regions in the die areas (not shown) in the subsequent development, the portion 701 of the lower layer is patterned, together with the lower layer in the die areas, into corresponding line patterns in the subsequent etching process for patterning the lower layer. The line patterns include a first set of x-directional line patterns 701a arranged in the y-direction in the one half of the first region 704 and defined by the Y-dipole exposure step, a second set of x-directional line patterns 701b arranged in the y-direction in the one half of the second region 706 and defined by the Y-dipole exposure step, a first set of y-directional line patterns 701c arranged in the x-direction in the one half of the third region 708 and defined by the X-dipole exposure step, and a second set of y-directional line patterns 701d arranged in the x-direction in the one half of the fourth region 710 and defined by the X-dipole exposure step.

After an upper layer (not shown) is formed over the wafer, a lithography process is conducted using a third photomask that has die patterns (not shown) and an overlay mark area 78 with line patterns 79. With the lithography process, the die patterns on the third photomask are transferred to die areas on the wafer, and a patterned photoresist layer as a part of the overlay mark is formed within the overlay mark area on the wafer. The patterned photoresist layer includes a first set of x-directional photoresist bars 720a arranged in the y-direction in the other half of the first region 704, a second set of x-directional photoresist bars 720b arranged in the y-direction in the other half of the second region 706, a first set of y-directional photoresist bars 720c arranged in the x-direction in the other half of the third region 708, and a second set of y-directional bars 720d arranged in the x-direction in the other half of the fourth region 710.

It is noted that in the X-dipole exposure step, not only the region for forming the first set of x-directional linear unexposed regions 716 and the region for forming the second set of x-directional linear unexposed regions 718 but also the region for forming the first set of x-directional photoresist bars 720a and the region for forming the second set of x-directional photoresist bars 720b are masked by the light-blocking layers 73, while the region for forming the first set of y-directional photoresist bars 702c and the region for forming the second set of y-directional photoresist bars 720d are not masked. In the Y-dipole exposure step, not only the region for forming the first set of y-directional linear unexposed regions 712 and the region for forming the second set of y-directional linear unexposed regions 714 but also the region for forming the first set of y-directional photoresist bars 720c and the region for forming the second set of y-directional photoresist bars 720d are masked by the light-blocking layers 77, while the region for forming the first set of x-directional photoresist bars 720a and the region for forming the second set of x-directional photoresist bars 720b are not masked.

Moreover, it is preferred that the first set of x-directional line patterns 701a, the first set of y-directional line patterns 701c, the second set of x-directional line patterns 701b and the second set of y-directional line patterns 701d are not arranged adjacently and the first set of x-directional photoresist bars 720a, the first set of y-directional photoresist bars 720c, the second set of x-directional photoresist bars 720b and the second set of y-directional photoresist bars 720d are arranged adjacently.

The line patterns 72, 76 and 79 on the first to third photomasks are arranged such that when the patterns of the lower layer defined by the X-dipole exposure step and those defined by the Y-dipole exposure step are aligned with the upper layer in the x-direction and in the y-direction, respectively, the following relationships are satisfied. First, the central line of respective central lines of the x-directional line patterns 701a and the x-directional line patterns 701b and that of respective central lines of the x-directional photoresist bars 720a and the x-directional photoresist bars 720b coincide with each other. Second, the central line of respective central lines of the y-directional line patterns 701c and the y-directional line patterns 701d and that of respective central lines of the y-directional photoresist bars 720c and the y-directional photoresist bars 720d coincide with each other.

Accordingly, the y-directional alignment error of the patterns of the upper layer with those of the lower layer defined by the second exposure step can be derived as the y-directional shift of the central line of respective central lines of the bars 720a and the bars 720b relative to that of respective central lines of the line patterns 701a and the line patterns 701b. The x-directional alignment error of the patterns of the upper layer with those of the lower layer defined by the first exposure step is derived as the x-directional shift of the central line of respective central lines of the bars 720c and the bars 720d relative to that of respective central lines of the line patterns 701c and the line patterns 701d.

In a preferred case of the second embodiment, one line pattern 701a/b/c/d and one photoresist bar 720a/b/c/d have substantially the same width, and the pitch between the line patterns 701a/b/c/d or the photoresist bars 720a/b/c/d is about two times the width of one line pattern 701a/b/c/d or one photoresist bar 720a/b/c/d in each set of the line patterns or the photoresist bars, as in a conventional AIM-type overlay mark.

In addition, though the X-dipole exposure step is conducted before the Y-dipole exposure step in the above embodiment, it is also possible to alternatively conduct the Y-dipole exposure step before the X-dipole exposure step. This is also true for the following three embodiments 2.2-2.4.

Embodiment 2.2

Figure 8A:
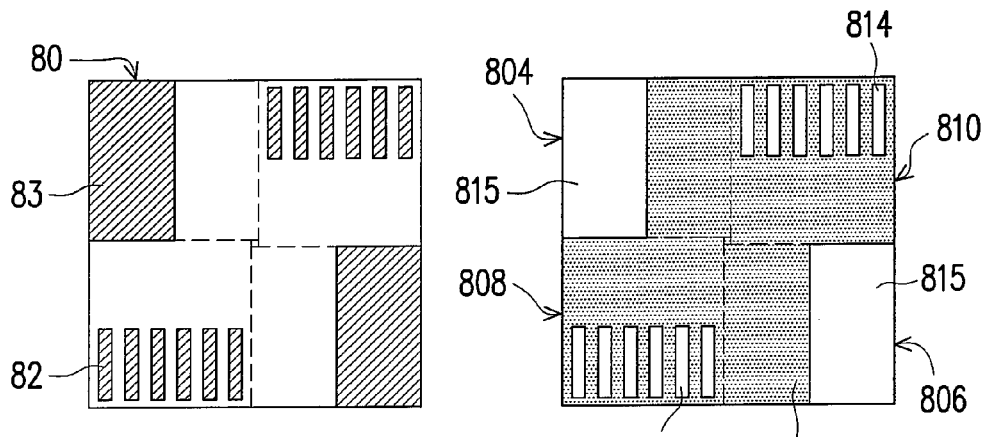
FIGS. 8A-8C illustrate a second method of forming an overlay mark according to the second embodiment of this invention, wherein FIG. 8C(b) shows the overlay mark.
Figure 8B:
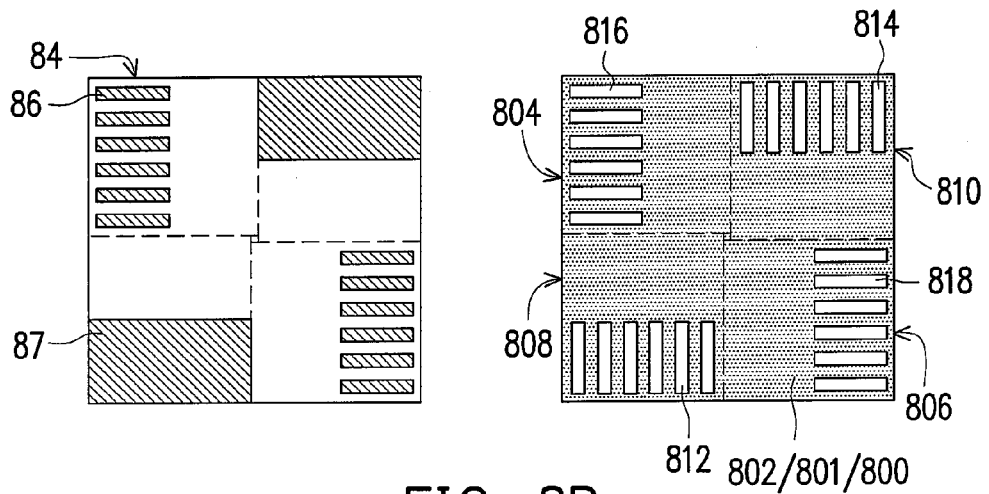
Figure 8C:
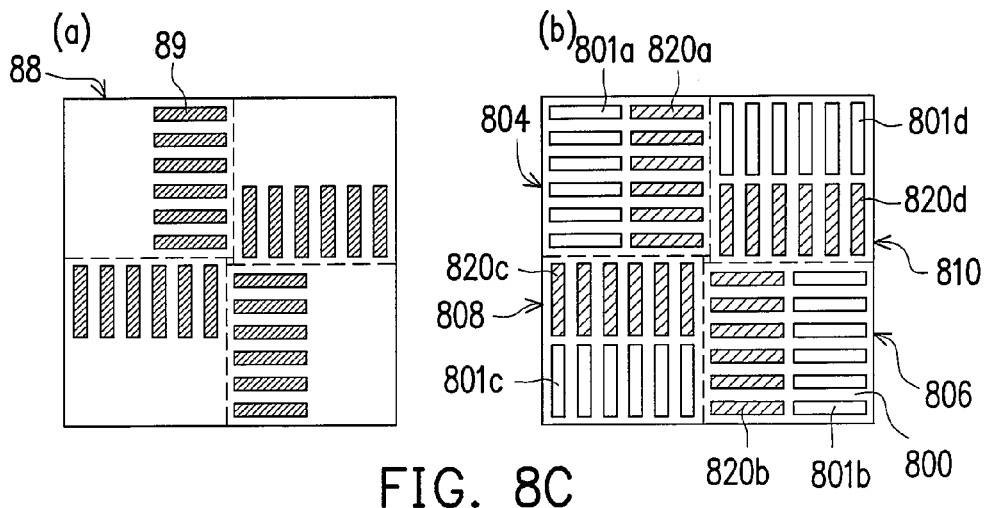

FIGS. 8A-8C illustrate a second method of forming an overlay mark according to the second embodiment of this invention, wherein FIG. 8C(b) shows the overlay mark.

Referring to FIG. 8A, after a positive photoresist layer 802 is formed on a lower layer that is on a substrate 800 and includes a portion 801 for forming the overlay mark, an X-dipole exposure step is conducted using a first photomask that has die patterns (not shown) and an overlay mark area 80 with x-directionally separated y-directional line patterns 82 and light-blocking layers 83. Through the X-dipole exposure step, the die patterns on the first photomask are transferred to the photoresist layer 802 in the die areas (not shown), and linear unexposed regions corresponding to the line patterns 82 are formed in the photoresist layer 802 on the portion 801 of the lower layer in the overlay mark area on the wafer.

The overlay mark area on the wafer includes four regions arranged in a 2×2 array that include a first region 804 and a second region 806 arranged diagonally and a third region 808 and a fourth region 810 arranged diagonally. The linear unexposed regions corresponding to the line patterns 82 include a first set of y-directional linear unexposed regions 812 arranged in the x-direction in one half of the third region 808 and a second set of y-directional linear unexposed regions 814 arranged in the x-direction in one half of the fourth region 810. Unexposed regions 815 are also formed occupying a half of the first region 804 and a half of the second region 806 for forming x-directional linear unexposed regions later because of the light-blocking layers 83. The line patterns 82 corresponding to the unexposed regions in each of the above sets are equally spaced.

Referring to FIG. 8B, a Y-dipole exposure step is conducted using a second photomask that has die patterns (not shown) and an overlay mark area 84 with y-directionally separated x-directional line patterns 86 and light-blocking layers 87. Through the Y-dipole exposure step, the die patterns on the second photomask are transferred to the photoresist layer 802 in the die areas (not shown), and linear unexposed regions corresponding to the line patterns 86 are formed in the photoresist layer 802 on the portion 801 of the lower layer. The linear unexposed regions include a first set of x-directional linear unexposed regions 816 arranged in the y-direction in one half of the first region 804 and a second set of x-directional linear unexposed regions 818 arranged in the y-direction in one half of the second region 806. The linear unexposed regions 812 and 814 formed previously are screened by the light-blocking layers 87 in the Y-dipole exposure step. The line patterns 86 corresponding to the linear unexposed regions in each of the above sets are also equally spaced.

Referring to FIG. 8C, since the photoresist material in the unexposed regions 812, 814, 816 and 818 is retained together with that in the unexposed regions in the die areas (not shown) in the subsequent development, the portion 801 of the lower layer is patterned, together with the lower layer in the die areas, into corresponding line patterns in the subsequent etching process of the lower layer. The line patterns include a first set of x-directional line patterns 801a arranged in the y-direction in the one half of the first region 804 and defined by the Y-dipole exposure step, a second set of x-directional line patterns 801b arranged in the y-direction in the one half of the second region 806 and defined by the Y-dipole exposure step, a first set of y-directional line patterns 801c arranged in the x-direction in the one half of the third region 808 and defined by the X-dipole exposure step, and a second set of y-directional line patterns 801d arranged in the x-direction in the one half of the fourth region 810 and defined by the X-dipole exposure step.

After an upper layer (not shown) is formed over the wafer, a lithography process is conducted using a third photomask that has die patterns (not shown) and an overlay mark area 88 with line patterns 89. With the lithography process, the die patterns on the third photomask are transferred to die areas on the wafer, and a patterned photoresist layer as a part of the overlay mark is formed within the overlay mark area on the wafer. The patterned photoresist layer includes a first set of x-directional photoresist bars 820a arranged in the y-direction in the other half of the first region 804, a second set of x-directional photoresist bars 820b arranged in the y-direction in the other half of the second region 806, a first set of y-directional photoresist bars 820c arranged in the x-direction in the other half of the third region 808, and a second set of y-directional bars 820d arranged in the x-direction in the other half of the fourth region 810.

It is noted that in the X-dipole exposure step, only the region for forming the first set of x-directional linear unexposed regions 816 and the region for forming the second set of x-directional linear unexposed regions 818 are entirely masked. In the Y-dipole exposure step, only the region for forming the first set of y-directional linear unexposed regions 812 and the region for forming the second set of y-directional linear unexposed regions 814 are masked. The regions for forming the x-directional and y-directional photoresist bars 820a, 820b, 820c and 820d are all exposed through the X-dipole exposure step and the Y-dipole exposure step.

Moreover, it is preferred that the first set of x-directional line patterns 801a, the first set of y-directional line patterns 801c, the second set of x-directional line patterns 801b and the second set of y-directional line patterns 801d are not arranged adjacently and the first set of x-directional photoresist bars 820a, the first set of y-directional photoresist bars 820c, the second set of x-directional photoresist bars 820b and the second set of y-directional photoresist bars 820d are arranged adjacently.

The line patterns 82, 86 and 89 on the first to third photomasks are arranged as in the case of the line patterns 72, 76 and 79 in FIGS. 7A-7C, and are thus not described here for their arrangement. Meanwhile, the alignment error of the patterns of the upper layer with those of the lower layer can be derived as in the case of Embodiment 2.1, and the preferred width of one line pattern and the preferred pitch of parallel line patterns can be the same as in Embodiment 2.1.

Embodiment 2.3

Figure 9A:
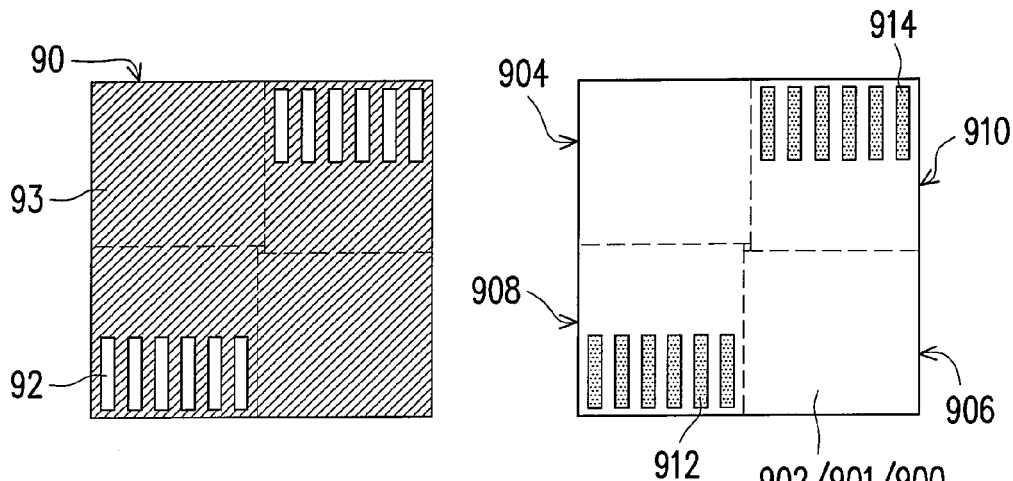
FIGS. 9A-9C illustrate a third method of forming an overlay mark according to the second embodiment of this invention, wherein FIG. 9C(b) shows the overlay mark.
Figure 9B:
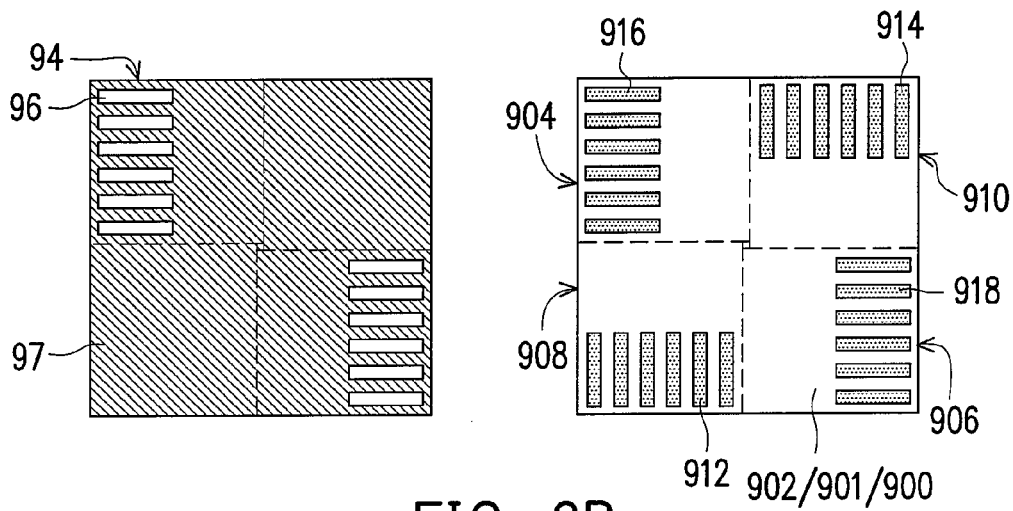
Figure 9C:
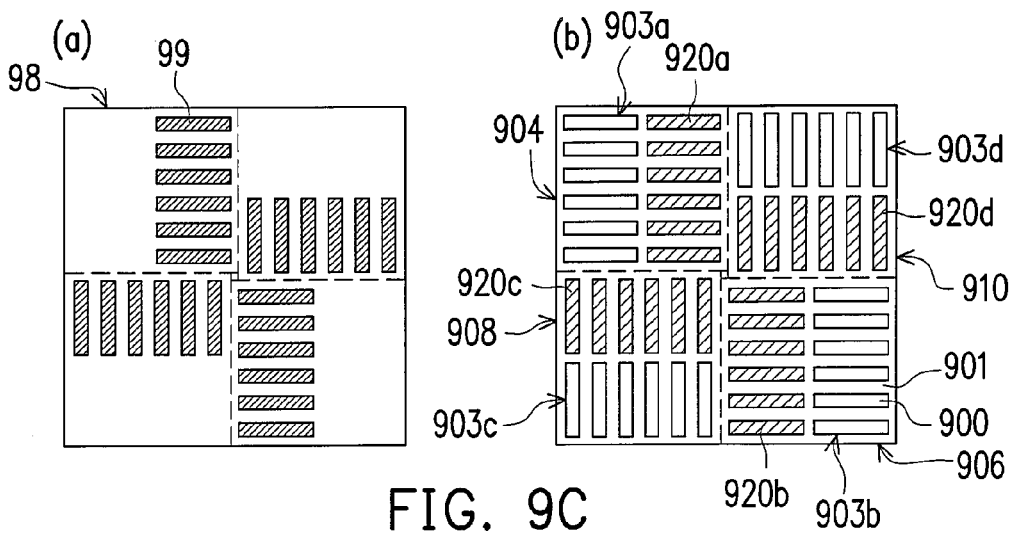

FIGS. 9A-9C illustrate a third method of forming an overlay mark according to the second embodiment of this invention, wherein FIG. 9C(b) shows the overlay mark.

Referring to FIG. 9A, after a positive photoresist layer 902 is formed on a lower layer that is on a substrate 900 and includes a portion 901 for forming the overlay mark, an X-dipole exposure step is conducted using a first photomask that has die patterns (not shown) and an overlay mark area 90 with x-directionally separated y-directional trench patterns 92 in a light-blocking layer 93. Through the X-dipole exposure step, the die patterns on the first photomask are transferred to the photoresist layer 902 in the die areas (not shown), and linear exposed regions corresponding to the trench patterns 92 are formed in the photoresist layer 902 on the portion 901 of the lower layer in the overlay mark area on the wafer.

The overlay mark area on the wafer includes four regions arranged in a 2×2 array that include a first region 904 and a second region 906 arranged diagonally and a third region 908 and a fourth region 910 arranged diagonally. The linear exposed regions corresponding to the trench patterns 92 include a first set of y-directional linear exposed regions 912 arranged in the x-direction in one half of the third region 908 and a second set of y-directional linear exposed regions 914 arranged in the x-direction in one half of the fourth region 910. The rest of the photoresist layer 902 on the portion 901 of the lower layer constitutes an unexposed region. The trench patterns 92 corresponding to the linear exposed regions in each of the above sets are equally spaced.

Referring to FIG. 9B, a Y-dipole exposure step is conducted using a second photomask that has die patterns (not shown) and an overlay mark area 94 with y-directionally separated x-directional trench patterns 96 in a light-blocking layer 97. Through the Y-dipole exposure step, the die patterns on the second photomask are transferred to the photoresist layer 902 in the die areas (not shown), and linear exposed regions corresponding to the trench patterns 96 are formed in the photoresist layer 902 on the portion 901 of the lower layer. The linear exposed regions include a first set of x-directional linear exposed regions 916 arranged in the y-direction in one half of the first region 904 and a second set of x-directional linear exposed regions 918 arranged in the y-direction in one half of the second region 906. The regions for forming the linear exposed regions 912 and 914 formed previously in the X-dipole exposure step are masked by the light-blocking layer 97 in the Y-dipole exposure step. The trench patterns 96 corresponding to the linear exposed regions in each of the above sets are also equally spaced.

Referring to FIG. 9C, since the photoresist material in the exposed regions 912, 914, 916 and 918 is removed together with that in the exposed regions in the die areas (not shown) in the subsequent development, the portion 901 of the lower layer is patterned, together with the lower layer in the die areas, to form corresponding trenches therein in the subsequent etching process of the lower layer. The trenches include a first set of x-directional trenches 903a arranged in the y-direction in the one half of the first region 904 and defined by the Y-dipole exposure step, a second set of x-directional trenches 903b arranged in the y-direction in the one half of the second region 906 and defined by the Y-dipole exposure step, a first set of y-directional trenches 903c arranged in the x-direction in the one half of the third region 908 and defined by the X-dipole exposure step, and a second set of y-directional trenches 903d arranged in the x-direction in the one half of the fourth region 910 and defined by the X-dipole exposure step.

After an upper layer (not shown) is formed over the wafer, a lithography process is conducted using a third photomask that has die patterns (not shown) and an overlay mark area 98 with line patterns 99. With the lithography process, the die patterns on the third photomask are transferred to die areas on the wafer, and a patterned photoresist layer as a part of the overlay mark is formed on the portion 901 of the lower layer. The patterned photoresist layer includes a first set of x-directional photoresist bars 920a arranged in the y-direction in the other half of the first region 904, a second set of x-directional photoresist bars 920b arranged in the y-direction in the other half of the second region 906, a first set of y-directional photoresist bars 920c arranged in the x-direction in the other half of the third region 908, and a second set of y-directional bars 920d arranged in the x-direction in the other half of the fourth region 910.

It is noted that in the X-dipole exposure step, not only the region for forming the first set of x-directional linear exposed regions 916 and the region for forming the second set of x-directional linear exposed regions 918 but also all the regions for forming the x-directional and y-directional photoresist bars 920a, 920b, 920c and 920d are masked by the light-blocking layer 93. In the Y-dipole exposure step, not only the region for forming the first set of y-directional linear exposed regions 912 and the region for forming the second set of y-directional linear exposed regions 914 but also all the regions for forming the x-directional and y-directional photoresist bars 920a, 920b, 920c and 920d are masked by the light-blocking layer 97. Accordingly, the regions for forming the x-directional and y-directional photoresist bars 920a, 920b, 920c and 920d are all masked through the X-dipole exposure step and the Y-dipole exposure step.

Moreover, it is preferred that the first set of x-directional trenches 903a, the first set of y-directional trenches 903c, the second set of x-directional trenches 903b and the second set of y-directional trenches 903d are not arranged adjacently and the first set of x-directional photoresist bars 920a, the first set of y-directional photoresist bars 920c, the second set of x-directional photoresist bars 920b and the second set of y-directional photoresist bars 920d are arranged adjacently.

The trench patterns 92 and 96 and the line patterns 99 on the above first to third photomasks are arranged similar to the case of the line patterns 72 and 76 and the line patterns 79 in FIGS. 7A-7C, and are thus not described here for their arrangement. Meanwhile, the alignment error of the patterns of the upper layer with those of the lower layer can be derived by a method analogous to that described in Embodiment 2.1 and is different from the latter only in that the position measurement about the lower layer is done to trenches rather than line patterns. The preferred width of one trench and the preferred pitch of parallel trenches can be substantially the same as the preferred width of one line pattern and the preferred pitch of parallel line patterns in Embodiment 2.1.

Embodiment 2.4

Figure 10A:
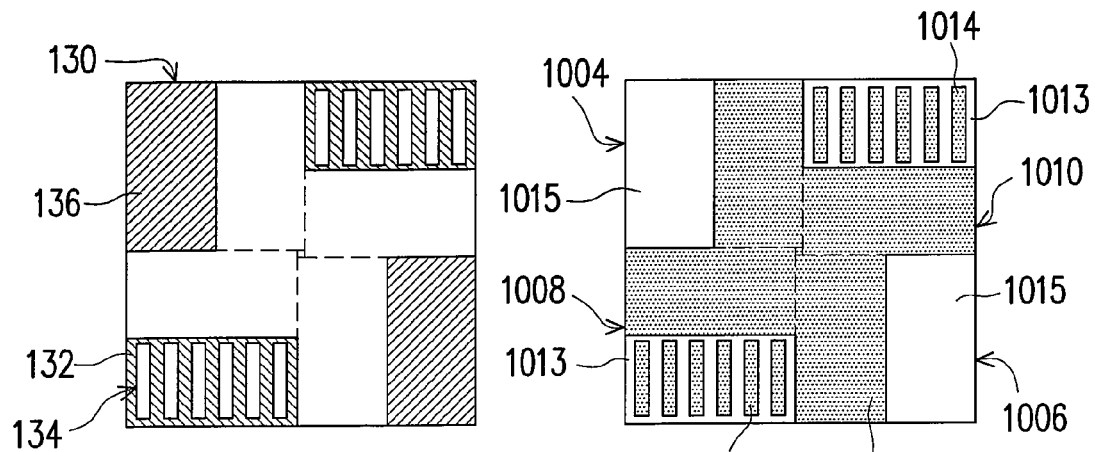
FIGS. 10A-10C illustrate a fourth method of forming an overlay mark according to the $2^{nd}$ embodiment of this invention, wherein FIG. 10C(b) shows the overlay mark.
Figure 10B:
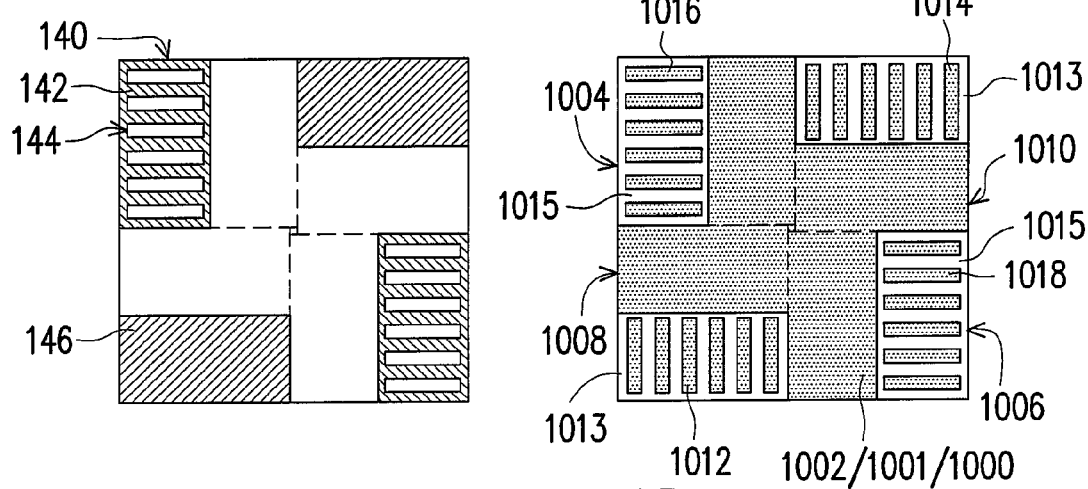
Figure 10C:
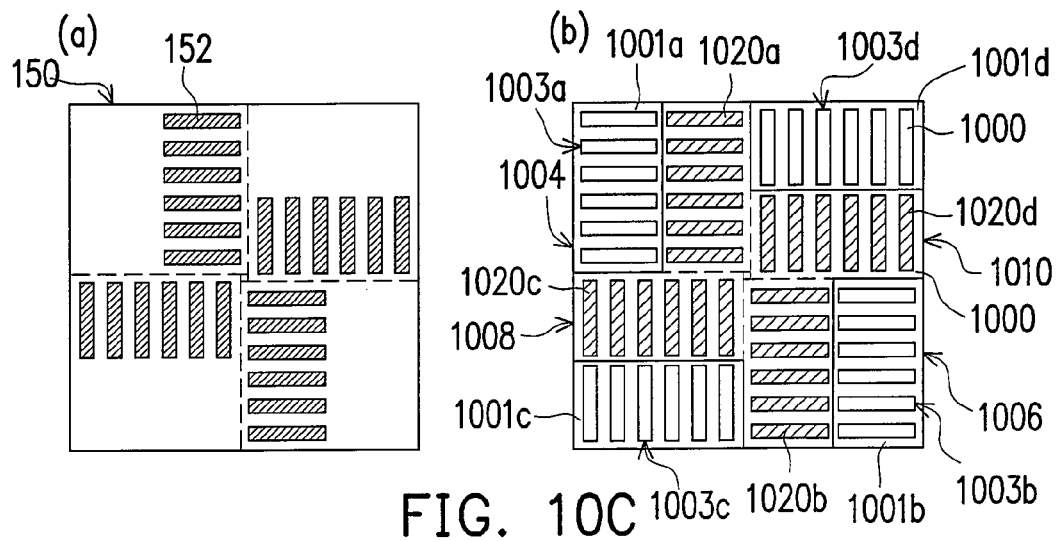

FIGS. 10A-10C illustrate a fourth method of forming an overlay mark according to the $2^{nd}$ embodiment of this invention, wherein FIG. 10C(b) shows the overlay mark.

Referring to FIG. 10A, after a positive photoresist layer 1002 is formed on a lower layer that is on a substrate 1000 and includes a portion 1001 for forming the overlay mark, an X-dipole exposure step is conducted using a first photomask that has die patterns (not shown) and an overlay mark area 130 with light-blocking layers 132 and 136 and x-directionally separated y-directional trench patterns 134 in the light-blocking layers 132. Through the X-dipole exposure step, the die patterns on the first photomask are transferred to the photoresist layer 1002 in the die areas (not shown), and unexposed regions corresponding to the light-blocking layers 132 and 136 as well as linear exposed regions, which correspond to the trench patterns 134 and are surrounded by unexposed regions, are formed in the photoresist layer 1002 on the portion 1001 of the lower layer in the overlay mark area on the wafer.

The overlay mark area on the wafer includes four regions arranged in a 2×2 array that include a first region 1004 and a second region 1006 arranged diagonally and a third region 1008 and a fourth region 1010 arranged diagonally. The unexposed regions 1015 corresponding to the light-blocking layers 136 are in the first region 1004 and the second region 1006, reserved for the formation of x-directional exposed regions later. The unexposed regions 1013 corresponding to the light-blocking layers 132 are in the third region 1008 and the fourth region 1010, surrounding linear exposed regions that correspond to the trench patterns 134 and include a first set of y-directional linear exposed regions 1012 arranged in the x-direction in one half of the third region 1008 and a second set of y-directional linear exposed regions 1014 arranged in the x-direction in one half of the fourth region 1010. The rest of the photoresist layer 1002 on the portion 1001 of the lower layer constitutes a pinwheel-like exposed region. The trench patterns 134 corresponding to the linear exposed regions in each of the above sets are equally spaced.

Referring to FIG. 10B, a Y-dipole exposure step is conducted using a second photomask that has die patterns (not shown) and an overlay mark area 140 with light-blocking layers 142 and 146 and y-directionally separated x-directional trench patterns 144 in the light-blocking layers 142. Through the Y-dipole exposure step, the die patterns on the second photomask are transferred to the photoresist layer 1002 in the die areas (not shown), and linear exposed regions corresponding to the trench patterns 144 are formed in the previously unexposed regions 1015 in the photoresist layer 1002 on the portion 1001 of the lower layer. The linear exposed regions include a first set of x-directional linear exposed regions 1016 arranged in the y-direction in one half of the first region 1004 and a second set of x-directional linear exposed regions 1018 arranged in the y-direction in one half of the second region 1006. The regions for forming the linear exposed regions 1012 and 1014 formed previously in the X-dipole exposure step are masked by the light-blocking layers 146 in the Y-dipole exposure step. The trench patterns 144 corresponding to the linear exposed regions in each of the above sets are also equally spaced.

Referring to FIG. 10C, since the photoresist material in the exposed regions 1012, 1014, 1016 and 1018 and the pinwheel-like exposed region of the photoresist layer 1002 on the portion 1001 of the lower layer is removed together with that in the exposed regions in the die areas (not shown) in the subsequent development, the portion 1001 of the lower layer is patterned, together with the lower layer in the die areas, into corresponding islands with trenches therein in the subsequent etching step for patterning the lower layer. The islands include a first island 1001a with a first set of x-directional trenches 1003a arranged in the y-direction and defined by the Y-dipole exposure step therein in the one half of the first region 1004, a second island 1001b with a second set of x-directional trenches 1003b arranged in the y-direction and defined by the Y-dipole exposure step therein in the one half of the second region 1006, a third island 1001c with a first set of y-directional trenches 1003c arranged in the x-direction and defined by the X-dipole exposure step therein in the one half of the third region 1008, and a fourth island 1001d with a second set of y-directional trenches 1003d arranged in the x-direction and defined by the X-dipole exposure step therein in the one half of the fourth region 1010.

After an upper layer (not shown) is formed over the wafer, a lithography process is conducted using a third photomask that has die patterns (not shown) and an overlay mark area 150 with line patterns 152. With the lithography process, the die patterns on the third photomask are transferred to die areas on the wafer, and a patterned photoresist layer as a part of the overlay mark is formed on the substrate 1000 between the islands 1001a, 1001b, 1001c and 1001d. The patterned photoresist layer includes a first set of x-directional photoresist bars 1020a arranged in the y-direction in the other half of the first region 1004, a second set of x-directional photoresist bars 1020b arranged in the y-direction in the other half of the second region 1006, a first set of y-directional photoresist bars 1020c arranged in the x-direction in the other half of the third region 1008, and a second set of y-directional bars 1020d arranged in the x-direction in the other half of the fourth region 1010.

It is noted that in the X-dipole exposure step, only the region for forming the first set of x-directional linear exposed regions 1016 and the region for forming the second set of x-directional linear exposed regions 1018 are entirely masked, while all the regions for forming the x-directional and y-directional photoresist bars 1020a, 1020b, 1020c and 1020d are exposed. In the Y-dipole exposure step, only the region for forming the first set of y-directional linear exposed regions 1012 and the region for forming the second set of y-directional linear exposed regions 1014 are entirely masked, while all the regions for forming the x-directional and y-directional photoresist bars 1020a, 1020b, 1020c and 1020d are exposed. Accordingly, all the regions for forming the x-directional and y-directional photoresist bars 1020a, 1020b, 1020c and 1020d are exposed through the X-dipole exposure step and the Y-dipole exposure step.

Moreover, it is preferred that the first set of x-directional trenches 1003a, the first set of y-directional trenches 1003c, the second set of x-directional trenches 1003b and the second set of y-directional trenches 1003d are not arranged adjacently and the first set of x-directional photoresist bars 1020a, the first set of y-directional photoresist bars 1020c, the second set of x-directional photoresist bars 1020b and the second set of y-directional photoresist bars 1020d are arranged adjacently.

The trench patterns 134 and 144 and the line patterns 152 on the above first to third photomasks are arranged similar to the case of the line patterns 72 and 76 and the line patterns 79 in FIGS. 7A-7C, and are thus not described here for their arrangement. Meanwhile, the alignment error of the patterns of the upper layer with those of the lower layer can be derived by a method analogous to that described in Embodiment 2.1 and is different from the latter only in that the position measurement about the lower layer is done to trenches rather than line patterns. The preferred width of one trench and the preferred pitch of parallel trenches can be substantially the same as the preferred width of one line pattern and the preferred pitch of parallel line patterns respectively in Embodiment 2.1.

Figure 11A:
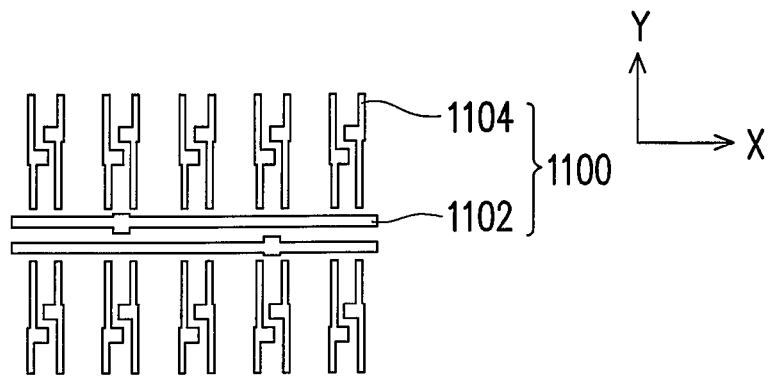
FIG. 11A illustrates an example of die patterns suitably defined by X-dipole and Y-dipole exposure steps and checked with the overlay mark of the second embodiment, and FIG. 11B/C illustrates the photomask patterns for the X-/Y-dipole exposure step.
Figure 11B:
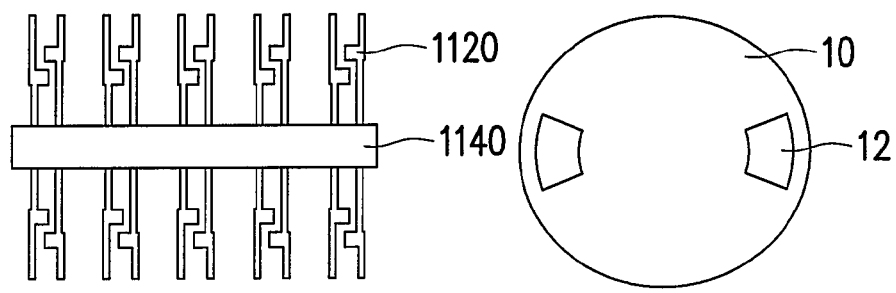

FIG. 11A illustrates an example of die patterns suitably defined by X-dipole and Y-dipole double exposure and checked with an overlay mark of the second embodiment, and FIG. 11B/C illustrates the photomask patterns for the X-/Y-dipole exposure step.

Referring to FIG. 11A, the patterns in this example are conductive line patterns 1100 including patterns 1102 requiring a higher resolution in the Y-direction and therefore suitably defined by Y-dipole exposure, and patterns 1104 requiring a higher resolution in the X-direction and therefore suitably defined with X-dipole exposure. The corresponding upper layer in this example is a dielectric layer (not shown) covering the patterns 1100, and the patterns of the upper layer are contact hole patterns. The lithography process including the X-dipole and Y-dipole double exposure process uses a positive photoresist layer.

Referring to FIG. 11B, the X-dipole off-axis light source 10 has two illumination regions 12 arranged in the X-direction with the central axis as the center of symmetry. The corresponding photomask includes patterns 1120 corresponding to the patterns 1104 to be defined in the die area and a pattern 1140 for screening the portion of the die area for forming the patterns 1102.

Figure 11C:
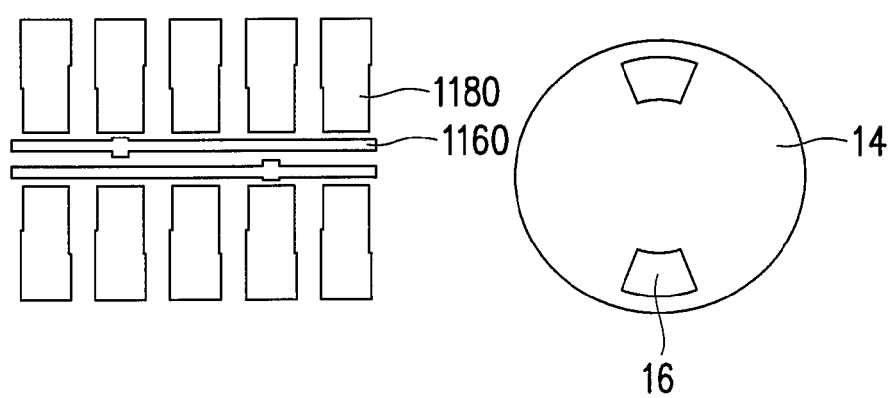

Referring to FIG. 11C, the Y-dipole off-axis light source 14 has two illumination regions 16 arranged in the Y-direction with the central axis as the center of symmetry. The corresponding photomask includes patterns 1160 corresponding to the patterns 1102 to be defined in the die area and patterns 1180 for screening the portions of the die area for forming the patterns 1104. The two photomasks are respectively used in the two exposure steps, and each of them is further formed, in an area thereof corresponding to a non-die area of the wafer, with patterns for defining a portion of the lower layer to form a part of the overlay mark of the second embodiment of this invention.

In a case where the overlay mark of FIG. 7C(b) is to be formed, the patterns for forming the overlay mark on the photomask having the die patterns 1120 and 1140 in FIG. 11B have to be those shown in the left of FIG. 7A, for y-directionally separated linear patterns can't be correctly transferred by X-dipole exposure. On the other hand, the patterns for forming the overlay mark on the photomask having the die patterns 1160 and 1180 in FIG. 11C have to be those in the left of FIG. 7B, for x-directionally separated linear patterns cannot be correctly transferred by Y-dipole exposure.

Thereby, the x-directional alignment between the contact pads of the patterns 1104 and corresponding contact holes in the upper layer can be checked based on the x-coordinates of the line patterns 701c and 701d and the photomask bars 720c and 720d, as mentioned above. Similarly, the y-directional alignment between the contact pads of the patterns 1102 and corresponding contact holes in the upper layer can be checked based on the y-coordinates of the line patterns 701a and 701b and the photomask bars 720a and 720b.

Since y-directionally separated x-directional linear patterns are well transferred with Y-dipole off-axis exposure light and x-directionally separated y-directional linear patterns are well transferred with X-dipole off-axis exposure light, the whole area of the overlay mark can be utilized in the alignment check. The x-directional alignment of the die patterns defined by the X-dipole exposure step and the y-directional alignment of those defined by the Y-dipole exposure step with the die patterns of the upper layer can be checked based on only one overlay mark.

Since the linear patterns defined by the first exposure step and those defined by the second exposure step are disposed together in one overlay mark of any of the above embodiments, the wafer area required for forming the overlay marks can be reduced by one half as the alignment accuracy between a lower layer defined by two exposure steps and an upper layer is to be checked.

This invention has been disclosed above in the preferred embodiments, but is not limited to those. It is known to persons skilled in the art that some modifications and innovations may be made without departing from the spirit and scope of this invention. Hence, the scope of this invention should be defined by the following claims.

What is claimed is:

1. A method of forming a mark in an IC-fabricating process, comprising:
    forming a plurality of first trenches in a portion of a material layer on a wafer through a first lithography process and a first etching process; and
    forming a plurality of second trenches in the portion of the material layer through a second lithography process and a second etching process, wherein
    the first trenches and the second trenches are arranged alternately, and
    a width of a first or second trench is substantially equal to a distance between a pair of first and second trenches that are closest to each other.

2. The method of claim 1, wherein
    the first trenches comprise a plurality of first x-directional trenches and a plurality of first y-directional trenches; and
    the second trenches comprise a plurality of second x-directional trenches arranged alternately with the first x-directional trenches and a plurality of second y-directional trenches arranged alternately with the first y-directional trenches.

3. The method of claim 1, wherein the mark is an overlay mark, further comprising:
    forming, over the portion of the material layer, a plurality of photoresist bars in a lithography process for defining an upper layer above the material layer after the first and second trenches are formed.

4. The method of claim 3, wherein
    the first trenches comprise a plurality of first x-directional trenches and a plurality of first y-directional trenches;

the second trenches comprise a plurality of second x-directional trenches arranged alternately with the first x-directional trenches and a plurality of second y-directional trenches arranged alternately with the first y-directional trenches; and the photoresist bars comprise a plurality of x-directional photoresist bars and a plurality of y-directional photoresist bars.

5. The method of claim 4, wherein the first x-directional trenches comprise a first set of x-directional trenches and a second set of x-directional trenches;

the first y-directional trenches comprise a first set of y-directional trenches and a second set of y-directional trenches;

the second x-directional trenches comprise a third set of x-directional trenches arranged alternately with the first set of x-directional trenches and a fourth set of x-directional trenches arranged alternately with the second set of x-directional trenches;

the second y-directional trenches comprise a third set of y-directional trenches arranged alternately with the first set of y-directional trenches and a fourth set of y-directional trenches arranged alternately with the second set of y-directional trenches;

the x-directional photoresist bars comprise a first set of x-directional photoresist bars beside the first and third sets of x-directional trenches and a second x-directional photoresist bars beside the second and fourth sets of x-directional trenches; and the y-directional photoresist bars comprise a first set of y-directional photoresist bars beside the first and third sets of y-directional trenches and a second y-directional photoresist bars beside the second and fourth sets of y-directional trenches.

6. The method of claim 5, wherein the first or third set of x-directional trenches, the first or third set of y-directional trenches, the second or fourth set of x-directional trenches and the second or fourth set of y-directional trenches are not arranged adjacently, and the first set of x-directional photoresist bars, the first set of y-directional photoresist bars, the second set of x-directional photoresist bars and the second set of y-directional photoresist bars are arranged adjacently.

* * * * *